United States Patent [19]

Bury

[11] Patent Number: 4,618,915
[45] Date of Patent: Oct. 21, 1986

[54] SUPPORT MEMBER FOR ELECTRICAL COMPONENTS

[75] Inventor: George J. Bury, Lake Villa, Ill.

[73] Assignee: Illinois Tool Works Inc., Chicago, Ill.

[21] Appl. No.: 682,503

[22] Filed: Dec. 17, 1984

[51] Int. Cl.⁴ ............................................. H05K 7/10
[52] U.S. Cl. ................................ 361/400; 174/138 G;
   248/221.3; 248/309.1; 361/392; 361/420
[58] Field of Search ............ 174/52 R, 59, 61, 138 G;
   361/390, 392–394, 400, 417, 419–420, 427;
   357/74; 248/221.3–221.4, 222.1, 309.1, 316.1;
   339/65, 126 RS, 126 R, 126 J, 127, 142, 252 R,
   252 S, 252 L, 254 M; 446/310, 311

[56] References Cited

U.S. PATENT DOCUMENTS

| | | | |
|---|---|---|---|
| 2,646,646 | 6/1953 | Glass | 446/310 |
| 3,829,817 | 8/1974 | Beavitt | 339/252 R X |
| 4,508,412 | 4/1985 | Daggett | 339/126 R |

Primary Examiner—Arthur T. Grimley
Assistant Examiner—Jane K. Lau
Attorney, Agent, or Firm—J. P. O'Brien; T. W. Buckman

[57] ABSTRACT

A support member for mounting an electrical component to a circuit board is constructed of a frame-like body portion, one or more retention members for coupling the body portion to a circuit board, and a socket arrangement for receiving and supporting the electrical component in a predetermined orientation relative to the body portion. The socket arrangement is constructed of a recess formed in the body portion for receiving the electrical component, one or more fingers projecting over an outer end portion of the recess for overlying a first surface portion of the electrical component therein, and a resilient spring-like element in the recess for resiliently urging the electrical component in a direction for positive engagement of the first surface thereof by the finger or fingers.

9 Claims, 6 Drawing Figures

U.S. Patent   Oct. 21, 1986   4,618,915
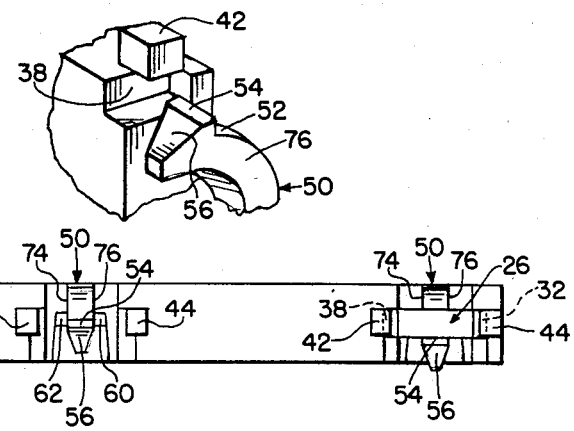
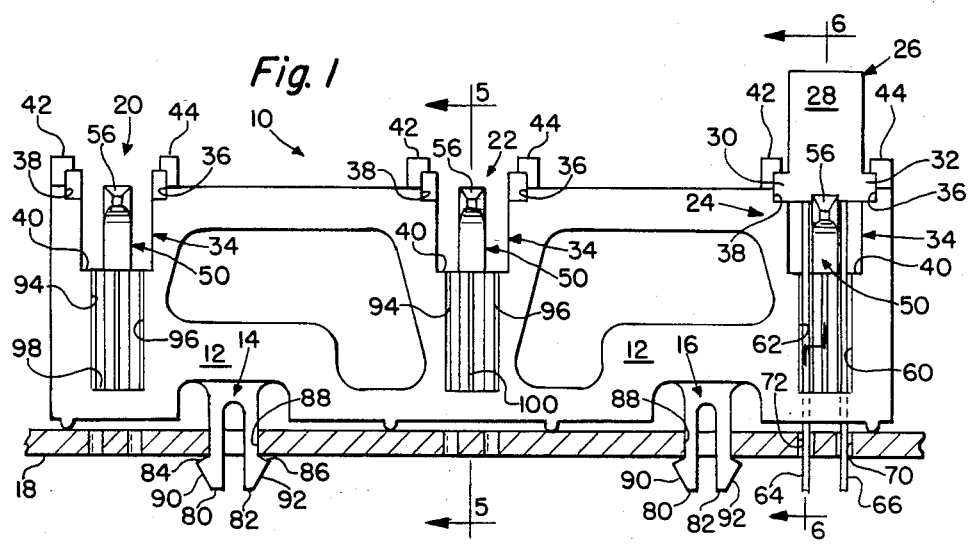
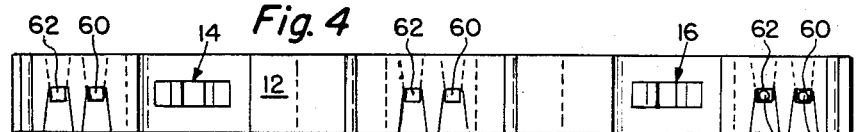
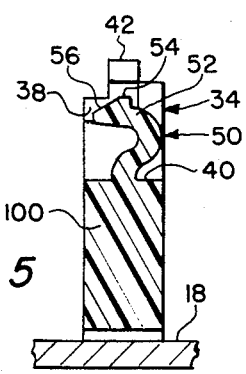
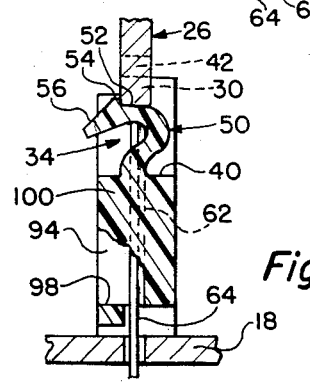

SUPPORT MEMBER FOR ELECTRICAL COMPONENTS

BACKGROUND OF THE INVENTION

This invention is directed generally to a support member for electrical components and more particularly to a one-piece integrally formed support member for mounting one or more electrical components in a predetermined orientation or attitude relative to a circuit board.

In many applications it is desirable to mount one or more electrical components to a circuit board in a fixed, predetermined orientation or attitude relative to the circuit board. For example, components such as indicator lamps or light emitting diodes (LEDs) must often be mounted for electrical connection with other components on the circuit board, while remaining in a given orientation for alignment with an external display panel. When the instrument or other device is fully assembled, it will be appreciated that the display panel will have some predetermined orientation relative to the circuit boards within the instrument. One or more lamps or LEDs may be intended as a portion of a display or may be intended to be viewed through suitable windows or the like in the display panel. Accordingly, these lamps or LEDs must be oriented in a given orientation with respect to the circuit boards on which they are mounted, to assure such visibility when the display panel is assembled with the device or instrument.

If each lamp or LED is merely affixed by its leads to the circuit board and thereafter the leads are bent or formed to achieve the desired attitude or orientation of the lamp or LED, much room for error exists. Particularly in the case where a plurality of such lamps or LEDs are mounted to a given circuit board, small errors in orienting one or more of the lamps can result in difficulty in finally aligning and assembling the display or other desired panel therewith. This in turn can lead to a great deal of relatively expensive individual manual adjustment of components for proper interfitting thereof during assembly.

This difficulty can be partially overcome through the use of various jigs or alignment fixtures during assembly, and preferably by the use of such jigs or alignment fixtures during soldering of the LED or lamp terminals to assure proper alignment thereof. Such jigs or fixtures would ordinarily be removed prior to final assembly of the display or other panels with the properly aligned bulbs or LEDs. Hence, care must be taken during such final assembly not to disturb the orientations of the LEDs or lamps.

OBJECTS AND SUMMARY OF THE INVENTION

Accordingly, it is a general object of the invention to provide a novel and improved support member for mounting one or more electrical components to a circuit board while avoiding the foregoing problems.

A related object is to provide a support member in accordance with the foregoing object which need not be removed following attachment of the electrical component to the circuit board.

A further related object is to provide a support member in accordance with the foregoing objects which is relatively simple and inexpensive in its design and construction and yet highly reliable in operation.

Briefly, and in accordance with the foregoing objects, a support member for mounting an electrical component to a circuit board comprises a frame-like body portion; retention means for coupling said body portion to a circuit board; and socket means for receiving and supporting said electrical component in a predetermined orientation relative to said body portion; wherein said socket means comprises a recess formed in said body portion for receiving said electrical component, finger means projecting over an outer end portion of said recess for overlying a first surface portion of said electrical component therein, and a resilient spring-like element in said recess for resiliently urging said electrical component in a direction for positive engagement of said first surface thereof by said finger means.

BRIEF DESCRIPTION OF THE DRAWINGS

The features of the present invention which are believed to be novel are set forth with particularity in the appended claims. The organization and manner of operation of the invention, together with further objects and advantages thereof, may best be understood by reference to the following description taken in connection with the accompanying drawings in the several figures of which like reference numerals identify like elements and in which:

FIG. 1 is a side elevation of a support member in accordance with the present invention together with a circuit board and an electrical component to be mounted in a desired orientation relative to the circuit board;

FIG. 2 is a top plan view of the support member and electrical component of FIG. 1;

FIG. 3 is an enlarged, partial perspective view illustrating further details of the support member of the invention;

FIG. 4 is a bottom plan view of the support member of FIG. 1;

FIG. 5 is a sectional view taken generally in the plane of the line 5—5 of FIG. 1; and FIG. 6 is a developmental view taken generally along the line 6—6 of FIG. 1

DETAILED DESCRIPTION OF THE ILLUSTRATED EMBODIMENT

Referring now to the drawings, and initially to FIG. 1 a support member for electrical components in accordance with the invention is designated generally by the reference numeral 10. This support member 10 generally comprises a frame-like body portion 12, retention means such as one or more retention members 14, 16 for coupling the body portion 12 to a circuit board 18 in a predetermined orientation relative thereto, and one or more sockets or socket means 20, 22 and 24 for receiving and supporting electrical components in a predetermined orientation relative to the body portion 12.

In the illustrated embodiment, one such electrical component 26 is shown received and supported by a socket or socket means 24, it being understood that the structure and operation of the other sockets or sockets means 20, 22 is substantially identical for receiving substantially identical circuit components. While the present invention will be described with particular reference to a light emitting diode (LED) comprising circuit component 26, it will be understood that the invention is not limited thereto. On the contrary, a support member in accordance with the invention may be utilized for mounting and supporting other electrical components of other shapes and configurations without departing from the invention.

In the illustrated embodiment, the LED 26 comprises a generally rectilinear and relatively thin body portion 28 which has formed at one end thereof a pair of generally oppositely outwardly extending flange portions 30, 32. Cooperatively, the socket arrangement or socket means 24 comprises a recess 34 in the frame-like body 12 dimensioned for receiving the electrical component or LED 26. More particularly, it will be seen that the recess 34 includes a pair of generally opposed and inwardly opening upper recess portions 36, 38 which are of generally increased lateral dimension as viewed in FIG. 1 for complimentary reception and support therein of the laterally outwardly projecting flange portions 30 and 32 of the LED 26. In this regard, the recess portions 36 and 38 define a generally rectilinear recess portion dimensioned to receive the outwardly projecting flanges 30 and 32. The remaining portion of recess 34 extends generally downwardly into the body portion 12 as viewed in FIG. 1, terminating generally in a bottom wall 40. Like portions of sockets 20 and 22 are designated in the drawings by like reference numerals.

In order to retain the component 26 within the recess 34, a pair of opposing, inwardly projecting finger means or fingers 42, 44 are provided generally overlying opposing outer edges of the recess 34 and more particularly, the top outer faces of recess portions 36 and 38. Accordingly, these inwardly projecting fingers 42 and 44 also overlie a first surface portion of the electrical component, which in the illustrated embodiment comprises the top surfaces, as viewed in FIG. 1, of the outwardly extending flange portions 30 and 32.

In accordance with a further feature of the invention, a resilient, spring-like element designated generally by reference numeral 50 is disposed in each recess 34 for resiliently urging the associated electrical component 26 in a direction for positive engagement with the first surface. That is, the upper surfaces of flanges 30 and 32 are urged into engagement with the inwardly projecting fingers 42 and 44. In the illustrated embodiment, this resilient spring-like element is of generally serpentine configuration as best viewed in FIGS. 5 and 6 and is integrally formed with the frame-like body 12. Moreover, this serpentine or spring-like element 50 includes an abutment surface 52 formed at an upper portion thereof, as viewed in FIGS. 1, 5 and 6, for engagement with a second surface portion of the electrical component which is generally opposite the first surface portion thereof. In the illustrated embodiment, this second surface portion comprises the bottom surface of LED 26 as viewed in FIG. 1, which is generally faces oppositely to the upper surfaces of flanges 30 and 32 which comprise the first surface, as previously mentioned.

As best viewed in FIGS. 5 and 6, the serpentine element 50 further includes a projecting lip portion 54 for engaging a third surface portion of the electrical component. In the illustrated embodiment, this third surface comprises the front surface of the LED 26 as viewed in FIG. 1. Hence, the lip portion 54 projects generally upwardly from abutment surface 52, as viewed in FIGS. 5 and 6, to engage a side or front wall portion of component 26 which is generally adjacent to the bottom surface thereof engaged by the abutment surface 52. Accordingly, it will be seen that the structure of the socket 24 as thus far described positively engages the electrical component or LED 26 at three different surfaces thereof so as to positively hold it in a predetermined orientation relative to the body 12. Since, as previously described, these retention members 14 and 16 hold and support the frame 12 at a predetermined orientation relative to circuit board 18, it will be recognized that the electrical component or LED 26 is thus also held at predetermined orientation relative to this circuit board 18.

In accordance with a further feature of the invention, the lip portion 54 has a tapered lead-in portion 56 which also comprises a leading edge part of the serpentine body 50. This taperd lead-in portion is engaged by the electrical component or LED during insertion thereof relative to the socket 24. Such engagement facilitates elastic deformation of the resilient serpentine body 50 in a generally downward direction to permit the electrical component to clear the lip 54. Thereafter, the serpentine body 50 resiliently returns to effect snapping engagement of the lip 54 with the front or facing surface of the component and similar engagement of the abutment surface with the second or bottom surface of the component for urging the component or LED upwardly for positive engagement of flanges 30 and 32 with fingers 42 and 44.

In accordance with a further feature of the illustrated embodiment, the body 12 further includes a pair of through apertures 60 and 62 for receiving respective leads 64 and 66 of the electrical component or LED 26 therethrough and for guiding these leads to the circuit board 18. In the illustrated embodiment, these through apertures 60 and 62 extend to the bottom surface of a frame-like body from project the retention members 14 and 16 to thereby guide the lead 64 and 66 to the circuit board 18. In this regard, the circuit board preferably has aligned through apertures 70 and 72 for receiving the leads 64 and 66 therethrough.

In this regard, it will be seen that the leads 64 and 66 are generally spaced apart and extend straight downwardly from the bottom surface of LED 26. Accordingly, the through apertures 60 and 62 are generally parallel and spaced apart. Moreover, the serpentine element or body 50 has generally flat, parallel sidewalls 74, 76 and is generally centered with respect to the recess 34. This arrangement permits passage of the leads to either side of element 50 and into the through apertures 60 and 62 which are generally parallel with each other and with the flat sides of the serpentine body 50, and extend to either side thereof and through bottom wall 40 of the recess 34.

Referring briefly to the retention means or members 14 and 16, it will be noted that these members are also integrally formed with the frame or body 12 and project integrally from a selected surface thereof. In the illustrated embodiment, members 14, 16 project from a bottom surface of the frame or body 12 as viewed in FIG. 1.

Each of these retention means or members 14 and 16 comprises a pair of similar resilient leg members 80 and 82, which have oppositely outwardly projecting camming surfaces 84 and 86 for snappingly engaging a complimentary formed through aperture 88 in the circuit board 18. These camming surfaces 84, 86 further include cam lead-in portions or surfaces 90 and 92 for initially engaging the through apertures 88 to effect relative inward retraction of the legs during insertion therethrough, and thereafter resilient return thereof for engagement of the camming surfaces behind the undersurface of circuit board 18.

In the illustrated embodiment, it will be noted that the serpentine element extends downwardly into bottom wall 40 of each recess 34 which in the illustrated embodiment extends laterally across recess 34 at a rear portion thereof. However at the front half or portion of bottom wall 40 of recess 34, the through apertures 60 and 62 extend forwardly to form a pair of elongate slots 94 and 96 extending through to the front surface of frame 12 as viewed in FIG. 1. These slots 94 and 96 further facilitate initial insertion of leads 64 and 66 with respect to through apertures 60 and 62. These slots 94 and 96 terminate in a bottom wall 98 through which the through apertures 60 and 62 continue en route to the bottom surface of body 12 as previously described. Flat sidewall portions 74, 76 of the serpentine member 50 thus generally continue downwardly the length of respective slots 94 and 96. Additionally, a forwardly extending, reduced thickness rib-like support portion 100 provides additional support for serpentine element or body 50 intermediate slots 94 and 96, and extends to bottom wall 98 thereof.

While particular embodiments of the invention have been shown and described in detail, it will be obvious to those skilled in the art that changes and modifications of the present invention, in its various aspects, may be made without departing from the invention in its broader aspects, some of which modifications being matters of routine engineering or design, and others being apparent only after study. As such, the scope of the invention should not be limited by the particular embodiment and specific construction described herein but should be defined by the appended claims and equivalents thereof. Accordingly, the aim in the appended claims is to cover such changes and modifications as fall within the true spirit and scope of the invention.

The invention is claimed as follows:

1. A support member for mounting at least one electrical component to a circuit board comprising: a frame-like body portion; retention means for coupling said body portion to said circuit board in a predetermined orientation relative thereto; socket means for receiving and supporting said electrical component in a predetermined orientation relative to said body portion; wherein said socket means comprises a recess formed in said body portion for receiving said electrical component, inwardly projecting finger means overlying opposing outer edges of said recess for overlying a first surface portion of said electrical component received in said recess means, and a resilient spring-like element in said recess for resiliently urging said electrical component in a direction for positive engagement of said first surface thereof by said inwardly projecting finger means.

2. A support member according to claim 1 wherein said spring-like element is integrally formed with said frame-like body portion.

3. A support member according to claim 2 wherein said retention means is integrally formed with said body portion.

4. A support member according to claim 1 wherein said spring-like element includes an abutment surface for engaging a second surface portion of said electrical component which is generally opposite said first surface portion.

5. A support member according to claim 4 wherein said spring-like element further includes a projecting lip portion projecting from said abutment surface for engaging a third surface portion of said electrical component; said socket means thereby positively engaging said electrical component at three surfaces thereof so as to positively hold said component in said predetermined orientation relative to said frame-like body portion.

6. A support member according to claim 1 wherein said frame-like body portion further includes a pair of through apertures for receiving leads of said electrical component therein and for guiding said leads to said circuit board.

7. A support member according to claim 1 wherein said retention means projects integrally from a selected surface of said frame-like body portion, and comprises a pair of similar resilient leg members having oppositely outwardly projecting camming surfaces for snapping engagement with respect to a complementary formed through aperture in said circuit board.

8. A support member according to claim 7 wherein said camming surfaces include cam lead-in surfaces for engaging inner edge portions of said through aperture of said circuit board to effect relative inward retraction of said legs and thereafter resilient return thereof for engagement of said camming surfaces behind an undersurface of said circuit board.

9. A support member for mounting electrical components having outwardly extending flange portions to a circuit board comprising: a frame-like body portion; retention means for coupling said body portion to a circuit board in a predetermined orientation relative thereto; and a plurality of socket means for receiving and supporting electrical components in a predetermined orientation relative to said body portion; wherein each of said socket means comprises recess means formed in said body portion for receiving at least a predetermined portion of one of said electrical components, inwardly projecting finger means overlying outer edge portions of said recess means for overlying said outwardly extending flange portions of said one electrical component therein, and a resilient spring-like element integrally formed with said body portion and disposed interiorly of said recess for engaging a bottom surface of said electrical component and resiliently urging said component for positive engagement of said flange portions thereof with said inwardly extending fingers.

* * * * *